United States Patent [19]

Germano et al.

[11] Patent Number: 4,538,087

[45] Date of Patent: Aug. 27, 1985

[54] ALTERNATING CURRENT DRIVEN PIEZOELECTRIC LATCHING RELAY AND METHOD OF OPERATION

[75] Inventors: Carmen P. Germano; John M. Davenport, both of Lyndhurst, Ohio

[73] Assignee: General Electric Company, Schenectady, N.Y.

[21] Appl. No.: 619,673

[22] Filed: Jun. 11, 1984

[51] Int. Cl.3 .............................................. H01L 41/08

[52] U.S. Cl. ............................... 310/332; 200/67 DB; 200/181; 310/317; 310/330; 310/331; 310/323; 310/358

[58] Field of Search ............... 310/311, 317, 323, 328, 310/330–332, 357–359; 200/DIG. 20, 181, 64, 67 R, 67 DA, 67 DB, 154, 325, 338

[56] References Cited

U.S. PATENT DOCUMENTS

| | | | |
|---|---|---|---|
| 2,166,763 | 7/1939 | Mason | 310/331 X |
| 3,109,901 | 11/1963 | Strauss | 200/67 DB |
| 3,821,747 | 6/1974 | Mason | 310/332 X |
| 4,395,651 | 7/1983 | Yamamoto | 310/331 X |
| 4,403,166 | 9/1963 | Tanaka et al. | 310/332 |

FOREIGN PATENT DOCUMENTS

| | | | |
|---|---|---|---|
| 783672 | 4/1968 | Canada | 200/181 |
| 450521 | 4/1968 | Switzerland | 200/67 DA |
| 1143822 | 2/1969 | United Kingdom | 310/330 |

*Primary Examiner*—Mark O. Budd

*Attorney, Agent, or Firm*—J. F. McDevitt; Philip L. Schlamp; Fred Jacob

[57] ABSTRACT

An alternating current latching relay is provided which employs a latching-type, mechanically operated snap-action switch mechanism with a set of electric contacts that are selectively latched either in the open or closed condition in a snap-action manner upon successive actuations of the snap-action mechanism by suitable push rod means for initiating its operation. At least one alternating current excited bender-type piezoelectric drive member has one end secured to a common base member with the latching-type snap-action switch mechanism and the remaining free end engaging the push rod means. An alternating current electric excitation signal is directly applied to the piezoelectric plate elements of the bender-type drive member for mechanically vibrating the bender-type drive member in a manner such that its amplitude of vibration quickly builds up to a value where it repeatedly strikes the push rod means with sufficient force to selectively actuate the snap-action switch mechanism to the opposite one of its two operating conditions from that in which it originally was set. A tuning mass in the form of a slug element is secured to the end of the bender-type drive member to reduce the natural resonant frequency of vibration of the bender-type drive member to substantially the frequency of the alternating current excitation signal to thereby increase the amplitude of its vibrations to a maximum. Additionally, the tuning mass increases the impulse delivered by the bender-type drive member to the push rod for actuating the snap-action mechanism.

42 Claims, 14 Drawing Figures

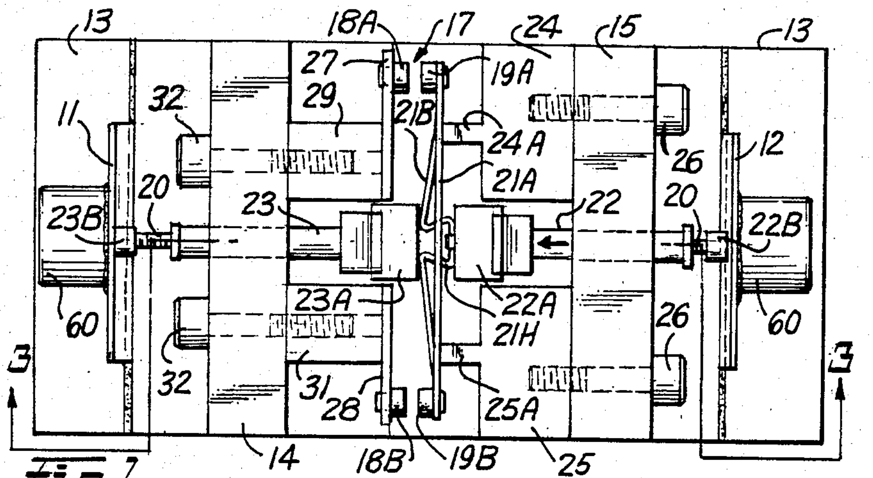
Fig. 1
OPEN
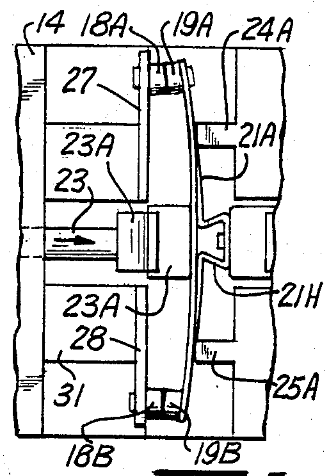
Fig. 2
CLOSED
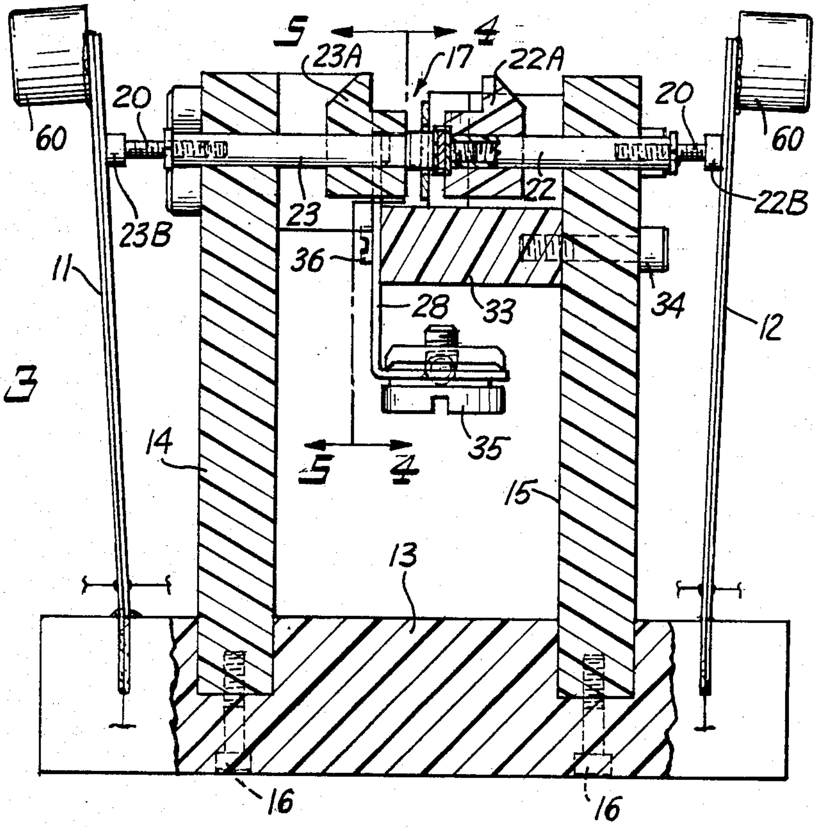
Fig. 3
Fig. 4
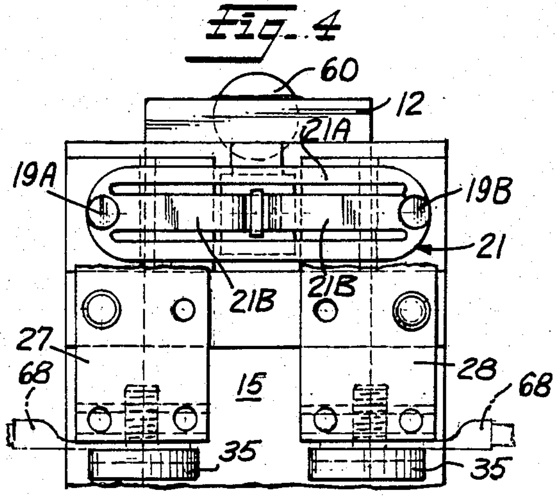
Fig. 5
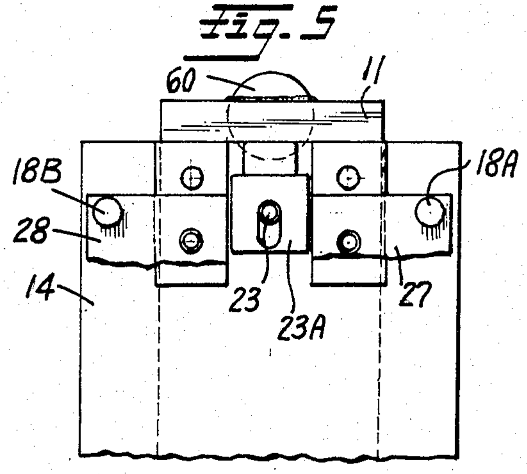

SNAP ACTION CONTACT SWITCHING MECHANISM
POLING FIELD
POLING FIELD
A.C. SUPPLY
PULL
PUSH
PULL
PUSH

Fig. 9
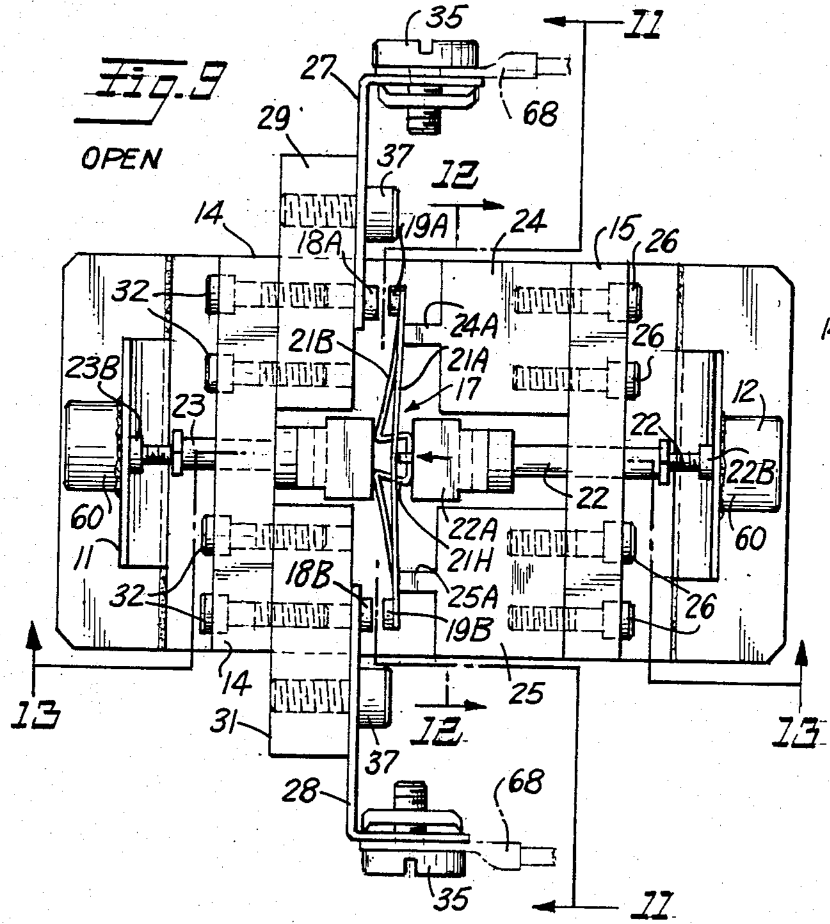
Fig. 10
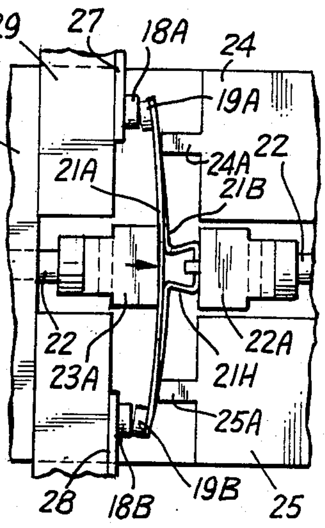
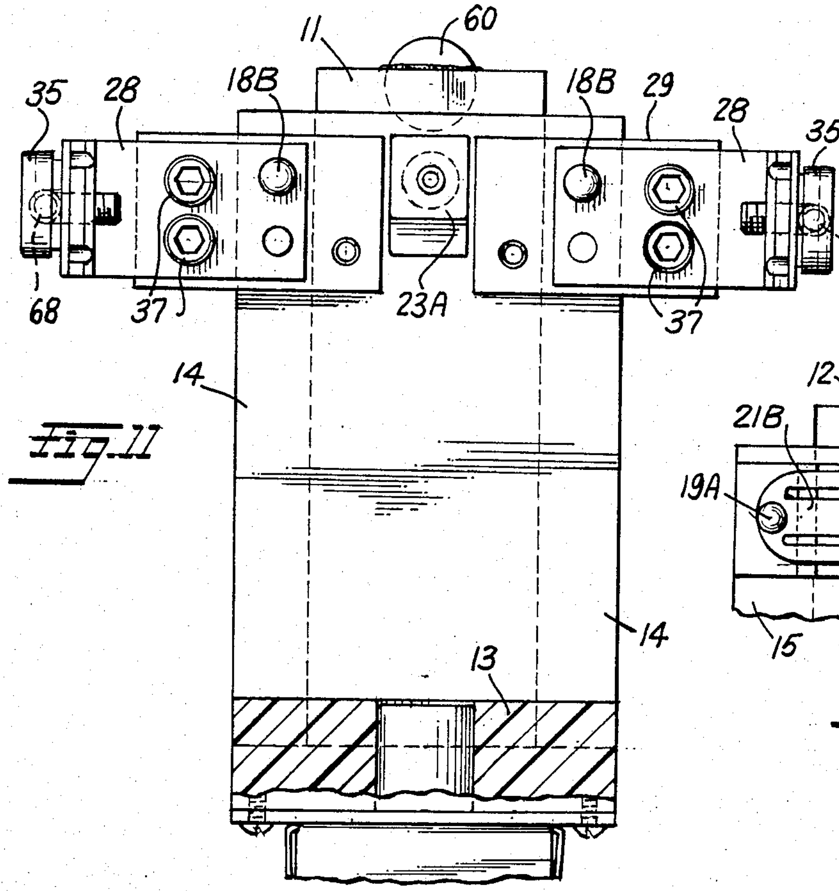
Fig. 11
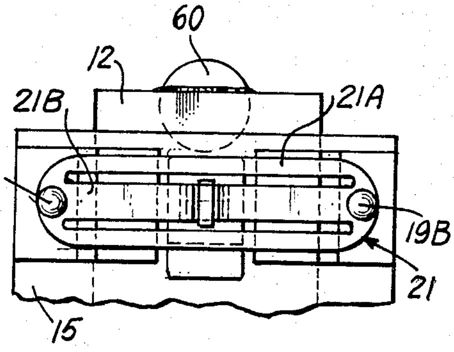
Fig. 12

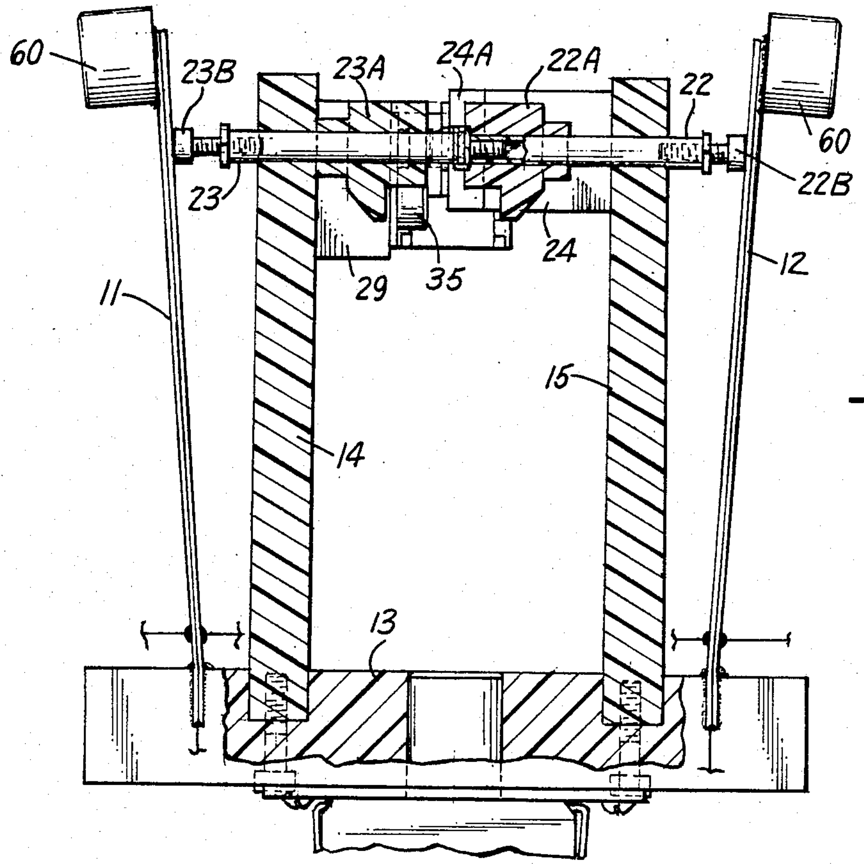
Fig. 13
Fig. 14
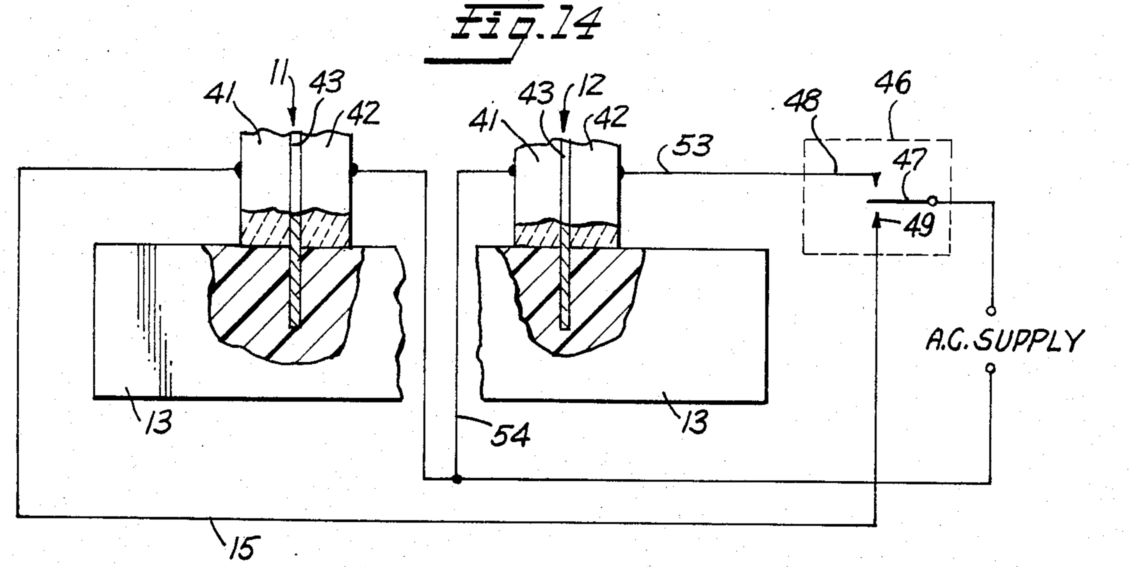

nism with a set of electric contacts that are selectively latched either in the open or closed condition in a snap-action manner upon successive actuations of the snap-action mechanism by suitable push rod means for initiating its operation. The improvement comprises providing at least one alternating current excited bender-type piezoelectric drive member having one end thereof secured to a common base member with the latching-type snap-action switch mechanism and the remaining free end engaging the push rod means. The invention further provides an improved method and means for selectively operating the relay with an alternating current electric excitation signal directly applied to the piezoelectric plate elements of the bender-type drive member for mechanically vibrating the bender-type drive member in a manner such that its amplitude of vibration quickly builds up to a value where it repeatedly strikes the push rod means with sufficient force to selectively actuate the snap-action switch mechanism to the opposite one of its two operating conditions from that in which it originally was set.

Another feature of the invention is the provision of a tuning mass in the form of a slug element secured to the end of the bender-type drive member to reduce the natural resonant frequency of vibration of the bender-type drive member to the frequency of the alternating current excitation signal to thereby increase the amplitude of its vibrations to a maximum. Additionally, the tuning mass increases the impulse delivered by the bender-type drive member to the push rod for actuating the snap-action mechanism.

In a preferred embodiment of the invention, the snap-action switch contact mechanism is of the type wherein axial movement of the push rod means in a first direction results in snap-action setting of the relay contacts in either an open or closed condition and reverse movement of the push rod results in snap-action setting of the relay contacts in the opposite condition. The relay includes at least two bender-type piezoelectric driven members the free ends of which engage opposite ends of the push rod for respectively driving the push rod in either of the two directions in a push-push manner to thereby selectively set the relay contacts in either an open or closed condition.

In a preferred embodiment of the invention, the bender-type piezoelectric drive members are bimorph bender-type piezoelectric drive members each having two piezoelectric plate elements secured together on each side of a common conductive plane in a unitary sandwich-like structure. The alternating current excitation signal selectively is applied in parallel across both piezoelectric plate elements to the common conductive plane for those applications, particularly if the AC power supply voltage is limited. In other applications, the alternating current excitation signal may be applied in series across both piezoelectric plate elements and the common conductive plane.

For larger power rated latching relays, a plurality of sets of bender-type piezoelectric drive members may be mechanically intercoupled to drive the push rod means in a push-push manner. The mechanical coupling may be achieved either through coupling rod member or alternatively the respective bender-type piezoelectric drive members may be comprised by a plurality of physically adjacent piezoelectric plate elements simultaneously electrically excited with alternating current excitation fields that are in-phase.

BRIEF DESCRIPTION OF DRAWINGS

These and other objects, features and many of the attendant advantages of this invention will be appreciated more readily as the same becomes better understood from a reading of the following detailed description when considered in connection with the accompanying drawings, wherein like parts in each of the several figures are identified by the same reference characters, and wherein:

FIG. 1 is a plan view of a piezoelectric driven alternating current latching relay constructed according to the invention and shown in the open circuit condition;

FIG. 2 is a fragmentary plan view similar to FIG. 1, but showing the relay in the closed circuit condition;

FIG. 3 is vertical sectional view taken through the staggered sectional line 3—3 of FIG. 1;

FIG. 4 is a fragmentary vertical view taken along the staggered sectional line 4—4 of FIG. 3;

FIG. 5 is a fragmentary vertical view taken along the staggered sectional line 5—5 of FIG. 3;

FIG. 9 is a plan view of a modified form of the alternating current latching relay constructed according to the invention which employs a snap-action switching mechanism shown in an open circuit condition and having electrical connectors extending from opposite sides of the mechanism for convenient access;

FIG. 10 is a fragmentary plan view of the latching relay of FIG. 9 but showing the snap-action contacts in a closed condition;

FIG. 11 is a vertical sectional view, partly in elevation, taken along the staggered sectional line 11—11 of FIG. 9;

FIG. 12 is a fragmentary vertical elevational view taken on the staggered sectional line 12—12 of FIG. 9;

FIG. 13 is a vertical sectional view taken in elevation along the staggered sectional line 13—13 of FIG. 9; and FIG. 14 is a partial schematic illustration showing a modified form of alternating current excitation circuit for use with the AC latching relays of FIGS. 1-5 and FIGS. 9-13.

BEST MODE OF PRACTICING THE INVENTION

Figures 6, 7, 8:
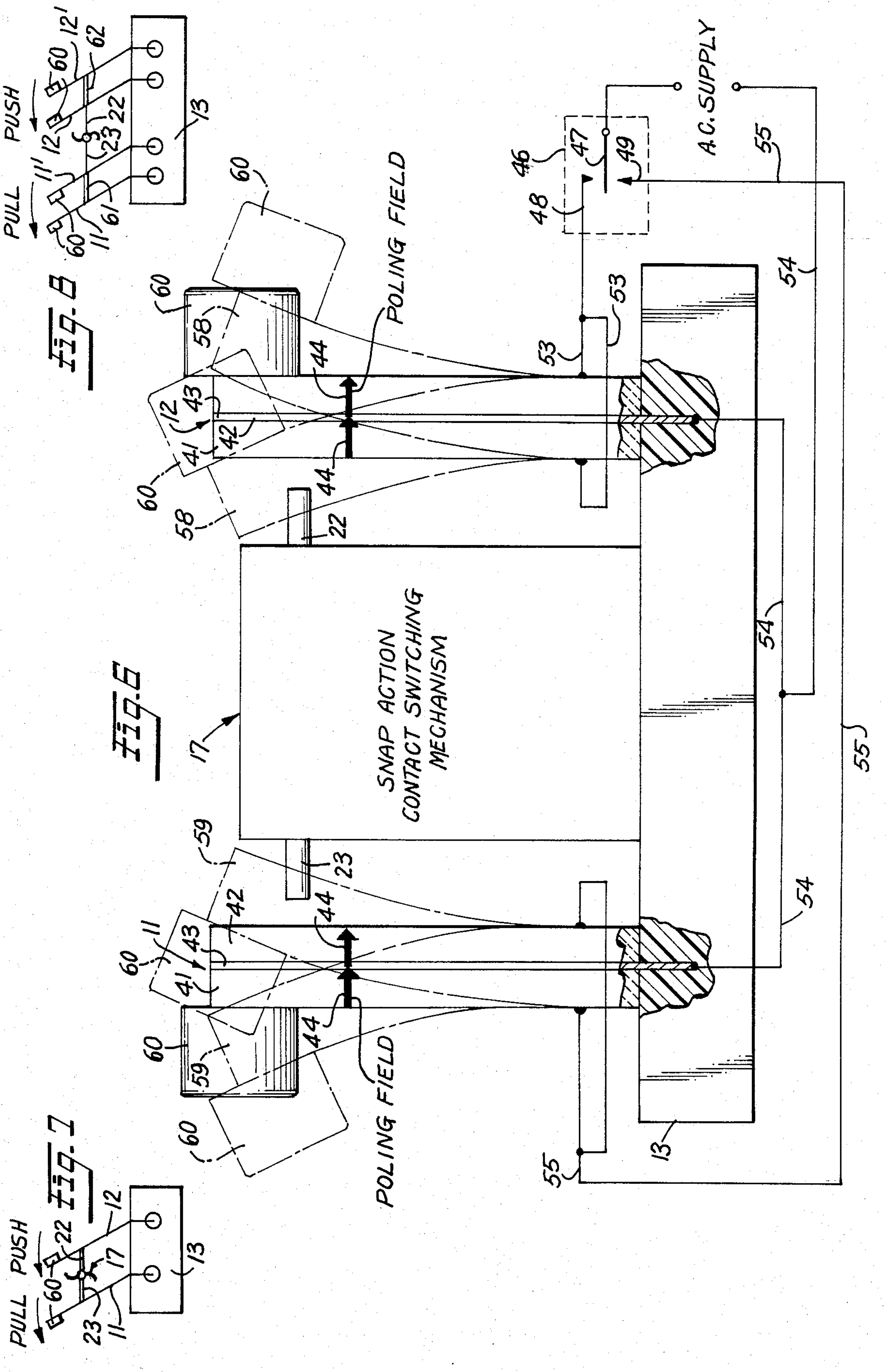
FIG. 6 is a functional schematic illustration of the alternating current latching relay of FIG. 1 together with alternating current signal excitation circuit illustrating the novel manner of actuating the piezoelectric bender-type drive members employed in the latching relay.
FIG. 7 is a modified schematic illustration of another embodiment of an alternating current latching relay of the invention showing a mechanical interconnection that can be used to obtain larger switching forces.
FIG. 8 is a modified schematic illustration showing still a different embodiment of the invention employing additional mechanical interconnections of a number of piezoelectric bender drive members whereby additional switching force can be obtained.

FIG. 1 is a plan view of one form of an alternating current latching relay constructed according to the present invention. As best seen in FIGS. 1-3, the improved latching relay is comprised by a set of two, spaced-apart, bender-type drive members 11 and 12 which are mounted in an insulating base member 13. The construction of the bender-type, piezoelectric drive members 11 and 12 will be described more fully hereinafter with relation to FIG. 6 of the drawings. In

ALTERNATING CURRENT DRIVEN PIEZOELECTRIC LATCHING RELAY AND METHOD OF OPERATION

TECHNICAL FIELD

This invention relates to latching relays of the type which when set in either a closed or open circuit condition, remain in that condition until reset to the opposite condition.

More specifically, the invention relates to alternating current relays which are actuated by an input alternating current electric potential and which employ a piezoelectric driving member in place of the conventional electromagnetic solenoid driving element.

BACKGROUND PRIOR ART PROBLEM

Historically, electrical relays and in particular power-rated relays, have been employed in switching situations where it is desired either to institute or interrupt electric current flow through a circuit. Conventionally, an electromagnetic solenoid operated relay has been used for this purpose wherein a small actuating signal current has been employed to either close or open the contacts of the power rated relay which then controls current flow from a larger current source through the relay contacts to a circuit being supplied via the relay. In the case of a latching relay, the contacts of the latching relay when set in either a closed or open circuit condition, remain in that condition until reset to the opposite condition by subsequent actuation of the electromagnetic solenoid employed to drive the larger current rated contacts of the latching relay to their opposite closed or opened condition.

Relays which use piezoelectric drive elements offer several advantages over their electromagnetic solenoid driven counterparts. Typically, a piezoelectric driven relay requires lower current and dissipates very little power in comparison to the electromagnetic solenoid driven relay. In addition, piezoelectric driven devices have a very low mass structure thereby employing less space with less weight and also possess very short actuation times. Thus, fast acting relay switching is possible with smaller and lower weight devices which also dissipate less power and hence operate at lower temperatures.

Previous attempts to provide piezoelectrically driven relays have resulted in relays having poor performance characteristics. In the case of bender-type piezoelectric direct current driven relays, the prior art devices implemented in this manner possess severe performance limitations which are founded in the trade-offs between contact force, contact separation, depolarization and the uncertainty of contact position due to creep and temperature effects which build up over a period of continued relay usage.

Prior art piezoelectrically driven relay devices have been described, for example, in U.S. Pat. No. 2,166,763 issued July 18, 1939 for a "Piezoelectric Apparatus and Circuits". In this apparatus a relay device having a piezoelectric bender-type drive member comprised by two juxtaposed piezoelectric plate elements is disclosed and is so designed that upon application of an electrical potential force between the input terminals to the device, one of the plate elements lengthens and the other shortens. As a result the bender-type drive member bends in the manner of a bimetallic thermostat and closes the contacts of a switch comprised by a fixed contact and a movable contact mounted on the piezoelectric plate elements. In this arrangement, one of the piezoelectric plate elements will have the actuating potential applied in phase with a pre-poling electric field and the other piezoelectric plate element will have the actuating signal of opposite polarity with a prepolarization field. As a consequence, with this type of device, long term depolarization of either one or both piezoelectric plate elements occurs due primarily to the depolarizing effects of the applied out of phase actuating signals. Similar objectionable characteristics are present in many of the prior art piezoelectrically driven bender-type switches and/or relay devices exemplified by the following patents: U.S. Pat. No. 2,182,340—issued Dec. 5, 1939 for "Signalling System"; U.S. Pat. No. 2,203,332—issued June 4, 1950 for "Piezoelectric Device"; U.S. Pat. No. 2,227,268—issued Dec. 31, 1940 for "Piezoelectric Apparatus"; U.S. Pat. No. 2,365,738—issued Dec. 26, 1944 for "Relay"; U.S. Pat. No. 2,714,642—issued Aug. 2, 1955 for "High Speed Relay of Electromechanical Transducer Material"; U.S. Pat. No. 4,093,883—issued June 6, 1978 for "Piezoelectric Multimorph Switches"; U.S. Pat. No. 4,395,651—issued July 26, 1983 for "Low Energy Relay Using Piezoelectric Bender Elements"; and U.S. Pat. No. 4,403,166—issued Sept. 6, 1983 for "Piezeoelectric Relay with Oppositely Bending Bimorphs".

In order to overcome the deficiencies of the known prior art piezoelectrically driven relays and switches noted above, the present invention was devised wherein an alternating current excitation signal is applied selectively to the piezoelectric drive members directly for a short period of time. Because of the alternating nature of the applied excitation signal, substantially no depolarization of the piezoelectric plate elements or long term deformation (known as creep) occurs during successive operations of the alternating current excited relaya over extended periods of usage.

SUMMARY OF INVENTION

It is therefor a primary object of the present invention to provide a new and improved alternating current latching relay of the type employing alternating current applied directly to a piezoelectric drive member for opening or closing the relay contacts of a latching relay and includes a novel AC signal excitation circuit and method of operation. In a preferred embodiment of the invention an AC actuating signal is applied directly to the piezeoelectric plate elements of a bender-type piezoelectric drive member to cause the drive member to mechanically resonate and repeatedly strike the actuating push rod of a snap-action switch mechanism that carries the relay switch contacts until the bender builds up sufficient force to actuate the snap-action switch mechanism to the opposite one of its two operating states from that in which it originally was set.

Another object of the invention is to provide an alternating current latching relay having the above-listed characteristics which has an enlarged mass formed on the vibrating end of the bender-type piezoelectric drive member for adjusting its natural resonant frequency of vibration to substantially equal the frequency of the excitation alternating current signal applied to the bender-type piezoelectric drive member.

In practicing the invention an alternating current latching relay is provided which employs a latching-type, mechanically operated snap-action switch mechaplane 43 formed by a plate, foil or coating into a unitary sandwich-like structure. The unitary structure thus comprised are bonded to the base member 13 in spaced-apart relationship to the snap-action contact switching mechanism 17 and with the free ends thereof adjacent to and engaging the free ends of the push rods 22 and 23. At this point, if not prior thereto, the piezoelectric plate elements 41 and 42 are pre-poled in a known manner with a poling electric field and may have a polarity such as indicated by the darkened arrows 44. The pre-poling of piezoelectric plate elements is a well known phenomenon in the art and serves to significantly enhance the piezoelectric characteristics of the plate elements.

The particular excitation circuit shown in FIG. 6, for example, comprises a pulse acutated switch shown schematically at 46 which serves to apply an alternating current electric signal selectively either to bender 11 or bender 12. The AC potential is derived from a suitable source of alternating current to be described more fully hereafter. The AC excitation voltage is applied via movable contact 47 of switch 46, and fixed contact 48 through a conductor 53 across the plate elements 41 and 42 via common conductive plane 43 and return conductor 54 to the input AC supply terminals. In a similar manner, the plate elements 41 and 42 of the bender-type piezoelectric drive member 11 selectively can be supplied with an AC exciting signal field via a pulse operated switch 46 movable contact 49, conductor 55 across plates 41 and 42 via common conductive plane 43 and return conductor 54 to the alternating current supply terminals. The switch 46, 47, 48, 49 is schematically illustrated as a manually operated switches but would be implemented with a solid state switch under the control of a suitable pulse timing circuit controlled by an operator (not shown).

In operation, assume that it is desired to switch the AC latching relay from its open circuit condition shown in FIG. 1 to its closed circuit condition shown in FIG. 2. To accomplish this, the drive rod means comprised by drive rods 22 and 23 must be moved from the position shown in FIG. 1 to the right to the position shown in FIG. 2. For this purpose, the bender-type piezoelectric drive member 11 must be excited so as to cause it to bend back and forth repetitively at the excitation alternating current frequency from its neutral or unexcited central position shown in solid lines in FIG. 6 to the right to the position shown in phantom lines at 59 where it will strike the end of push rod 23 with sufficient force to actuate the snap-action switch mechanism 17 from its position shown in FIG. 1 to that shown in FIG. 2. To do this the movable contact 47 of pulse actuated switch 46 is closed on fixed contact 49 for a short period thereby applying an AC excitation signal field across the plate elements 41, 42 of the bimorph bender-type peizoelectric drive member 11. The application of the AC excitation signal field causes bending of the bimorph drive member 11 back and forth to the right and left as shown by the phantom-like positions shown at 59 at the frequency of the excitation alternating current field. This oscillatory motion will build up in amplitude until bender member 11 pushes the push rod 23 to the right with sufficient force to result in snap-action switching of the relay contacts 18A, 19A and 18B, 19B from their open circuit condition shown in FIG. 1 to the closed circuit condition shown in FIG. 2. It is estimated that the switching action will be on the order of one second or less due primarily to the design of the snap-action switching mechanism 17 which requires a finite time period to move from its open circuit to its closed circuit condition. This action leaves the relay contacts 18A, 19A and 18B, 19B latched in their closed condition as shown in FIG. 2 where they will remain unless and until they are switched to their open condition as shown in FIG. 1.

To switch the AC latching relay back to its open circuit condition shown in FIG. 1, the pulse operated switch 46 is selectively actuated to close movable contact 47 on fixed contact 48 thereby applying an AC excitation signal to the piezoelectric plate elements 41, 42 of the bender-type drive member 12. As a result, the bender-type drive member 12 will be repetitively bent back and forth from its upright neutral or unexcited position shown in solid lines to the left as shown in phantom lines at 58 at the frequency of the AC excitation signal. This will result in the oscillatory motion of bimorph drive member 12 building up in amplitude until it engages the end of the push rod 22 and pushes it to the left with sufficient force to actuate the snap-action switching mechanism 17 and switch it from its closed condition shown in FIG. 2 to its open condition shown in FIG. 1.

In order to reduce the natural mechanical resonant frequency of the bender-type piezoelectric drive members 11 and 12 in an effort to match this frequency to the frequency of the excitation alternating current and thereby obtain maximum amplitude of movement of the bender-type drive members 11 and 12, a small mass in the form of a slug element 60 is secured to the end of each bender-type drive member as best shown in FIGS. 1, 2 and 6. This results in increasing the impulse force delivered by the bender-type drive members to the push rods 22 and 23 by a significant amount. This in turn allows the device to be operated at lower voltages than otherwise possible. For example, AC latching relays designed in this manner have been operated at 40–50 volts RMS level.

A considerable advantage of the novel AC latching relay according to the invention is the elimination of long term creep which results in a lasting undesired deformation of the bender-type piezoelectric drive members in one direction or the other after an extensive period of use. This phenomenon has been observed with prior art piezoelectric ceramic driven relay devices operated by static DC excitation fields required to hold the devices in one state or the other (i.e. open or closed). With the invention, excitation of the piezoelectric plate elements is required only for a short period or duration of time. This is made possible by the snap-action closing (or opening) of the relay contacts 18A, 19A and 18B, 19B comprising a part of the snap-action contact switching mechanism 17. Hence, no continued (static) DC excitation of either of the piezoelectric plate elements is required since the activating AC excitation signal applied to the piezoelectric plate elements whether the device is being driven in either a closure or opening mode, is of short duration long enough only to assure tripping the snap-action contact switching mechanism 17. This may require only one second or less, after which the AC exciting signal field is removed automatically. This is accomplished in the FIGS. 1–6 embodiments of the invention, for example, by the short duration of the closure of the movable contact 47 of switch 46 on either of the fixed contacts 48 or 49 which subjects the piezoelectric plate elements 41, 42 to only short duration electrically induced stresses.

between the spaced-apart bender-type piezoelectric drive members 11 and 12 are a set of spaced-apart upright insulating pedestals 14 and 15 secured to insulating base member 13 by set screws 16. Physically disposed between the spaced apart insulating support pedestals 14 and 15 is a snap-action switch mechanism shown generally at 17.

Snap-action switch mechanism 17 is comprised by a set of two spaced-apart fixed relay contacts 18A and 18B which are electrically insulated one from the other. Coacting with the fixed contacts 18A and 18B are a set of spaced-apart movable relay contacts 19A and 19B which are electrically interconnected via a conductive spring frame member 21 best seen in FIG. 4 of the drawings. Frame member 21 is comprised by an outer elliptically-shaped frame portion 21A having a central opening therein across which an inner flexible spring arm portion 21B is disposed. The inner flexible spring arm portion 21B has a horseshoe-shaped dimple 21H formed in its center portion. The bottom of the horseshoe-shaped dimple 21H engages an insulating end portion 22A of a linearly reciprocal drive rod 22 whose opposite insulating end 22B is engaged by the bender-type drive member 12 as best seen in FIG. 3. The open mouth of the horseshoe-shaped dimple 21H on inner flexible spring arm portion 21B is engaged by the insulating end 23A of a push rod 23, the opposite free end of which is engaged by the bender-type piezoelectric drive member 11. Both push rods 22 and 23 have threaded axial extensions 20 in the end thereof for assuring engagement with the respective bender members 12 and 11 in the at rest position. The push rods 22 and 23 are axially aligned and are supported in axially aligned openings in the upper ends of the respective upright mounting pedestals 15 and 14 within which they are axially movable.

A set of mounting blocks 24 and 25 are secured to the outer end of the upright mounting pedestal 15 by set screws 26 on each side of the opening accomodating the push rod 22. Blocks 24 and 25 have respective projections 24A and 25A formed thereon which extend to and engage the outer elliptically-shaped portion 21A of the movable contact spring frame member 21. By reason of this construction, upon the left-hand push rod 23 being axially pushed from its position shown in FIG. 1 where the relay contacts 18A, 19A and 18B, 19B are in their open circuit condition, to the right, the inner flexible spring arm portion 21B will be suddenly snapped from the position shown in FIG. 1 to the position shown in FIG. 2 where the relay contacts 18A, 19A, and 18B, 19B will be closed. This snap-action movement occurs as a result of the resilient spring nature of flexible spring arm portion 21B and the resistance provided by the projections 24A and 25A against movement of the outer elliptically-shaped portion 21A of the movable contact spring frame member 21. As a result of this resistance, and pressure exerted by the insulated end 23A of push rod 23 when moved to the right on the open mouth portion of the horseshoe-shaped dimple 21H of inner flexible spring arm portion 21, the inner flexible spring arm portion 21 after passing through a median position will immediately snap to the closed position shown in FIG. 2 where the movable contacts 19A and 19B secured to the ends of the movable contact spring frame member 21 will be closed on the fixed contacts 18A and 18B.

As best shown in FIGS. 1, 2 and 5 considered in conjunction with FIG. 3, the fixed contacts 18A and 18B are secured to respective bus bars 27 and 28 which in turn are mounted on insulating block members 29 and 31 secured to the insulating upright pedestal 14 by set screws 32. The respective bus bars 27 and 28 are electrically conductive and provide highly conductive current paths to the fixed relay contacts 18A and 18B to which they are respectively connected. For this purpose, each of the bus bars 27 and 28 extends below the level of the snap-action movable contact spring frame member 21. As best shown at 28 in FIG. 3, bus bars 27 and 28 are further physically supported by an additional insulating support member 33 secured to the upright insulating pedestal 15 by set screws 34 and to which each of the bus bars 27 and 28 are secured by respective set screws 36. The lower ends of each of the bus bars are bent to extend at right angles to the main body of the bus bars and form a dogear to which a screw cap 35 is threadably secured for connection of input leads to the relay device.

FIG. 6 is a schematic functional diagram of a new and improved alternating current latching relay constructed in accordance with FIGS. 1–5 and is useful in explaining operation and particularly the novel method of excitation for the alternating current relay device. In FIG. 6, the piezoelectric bender-type drive members are shown at 11 and 12 together with the snap-action contact switching mechanism 17 mounted on base member 13. In the preferred embodiment of the invention, bimorph bender-type piezoelectric drive elements are employed; however, the invention can be practiced with a unimorph, multi-morph or multi-layer piezoelectric bender-type drive member, and even multiple spaced-apart benders, as will be apparent to the reader hereafter. Bimorphs are commercially available bender-type peizoelectric members manufactured and sold by a number of suppliers including Vernitron Corporation of Long Island, N.Y.

For a more detailed description of the construction and operation of bender-type piezoelectric drive members, reference is made to a paper entitled "Flexure Mode Piezoelectric Transducers" by Carmen P. Germano appearing in the IEEE Transactions on Audio and Electro Acoustics, Volume AU-19, No. 3, March 1971, pages 6–12. Briefly, however, it can be said that flexure mode (bender-type) piezoelectric transducers have been known for a number of years and have been successfully used in a large number of applications. This is due to the ability of such transducers to generate high output voltage from a low mechanical impedance source, or conversely to develop large displacement at low levels of electrical excitation. The devices operate through the use of a pair of suitably oriented prepolarized piezoelectric plates which act on the principle of opposition to obtain built-in mechanical magnification of motion. The piezoelectric plate elements may be fabricated from a suitable polycrystalline ceramic such as barium titanate, lead zirconate titanate and the like or could be fabricated from naturally occuring piezoelectric materials such as quartz or Rochelle salt or materials such as ammonium dihydrogen phosphate. Other known materials exhibiting piezoelectric properties also could be used.

In FIG. 6, each of the respective bender-type piezoelectric drive members 11 and 12 comprise bimorph bender-type drive members wherein two piezoelectric plate elements 41 and 42 fabricated from a suitable piezoelectric substance such as those noted above are sandwiched together with an intermediate conductive are less susceptible to long term depolarization largely because of the large displacement of the bender members attributable to resonance operation and the greater impulse force applied to the push rod of the snap-action switch mechanism as a result of the small mass slug elements secured to the ends of the bender-type drive members. All of these features combine to reduce the criticality of the contact spacing in the relay device.

Having described several embodiments of a new and improved piezoelectric driven alternating current latching relay constructed in accordance with the invention, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. An alternating current latching relay including in combination at least one electrically actuated piezoelectric drive member, a latching type snap-action switch mechanism having a set of electrical contacts that are selectively latched either in the open or the closed condition in a snap-action manner upon successive actuations of the switch mechanism, operating push rod means for actuating the snap-action switch mechanism and engageable by the free end of the piezoelectric drive member whereby movement of the piezoelectric drive member selectively operates the snap-action switch mechanism, and selectively operable alternating current electric excitation circuit means connected to said piezoelectric drive member for selectively electrically exciting the piezoelectric element thereof with an alternating current electric excitation field whereby the piezoelectric drive member is caused to mechanically resonate and to repeatedly strike the engageable end of the push rod means with sufficient force to selectively actuate the snap-action switch mechanism to the opposite one of its two operating conditions from that in which it had been initially set.

2. An alternating current latching relay according to claim 1 wherein the piezoelectric drive member is a bender-type piezoelectric drive member the free end of which engages and hits the end of the operating push rod means repeatedly at a frequency dependent upon the frequency of the excitation alternating current so as to build up a sufficient magnitude of movement of the free end of the bender-type piezoelectric drive member and cause it to repeatedly hit the end of the push rod with sufficient force to selectively actuate the snap-action switch mechanism.

3. An alternating current latching relay according to claim 2 further including a mass secured to the free end of the bender-type piezoelectric drive member for adjusting its natural resonant frequency of vibration to substantially equal the frequency of the excitation alternating current.

4. An alternating current latching relay according to claim 1 wherein the snap-action switch contact mechanism is of the type wherein axial movement of the push rod means in a first direction results in snap-action setting of the relay contacts in either an open or closed condition and reverse movement of the push rod means results in snap-action setting of the relay contacts in the opposite condition and wherein the relay includes at least two bender-type piezoelectric drive members the free ends of which are engageable with opposite ends of the push rod means for respectively driving the push rod means in either of the two directions to thereby selectively set the relay in either an open or closed condition.

5. An alternating current latching relay according to claim 3 wherein the snap-action switch contact mechanism is of the type wherein axial movement of the push rod means in a first direction results in snap-action setting of the relay contacts in either an open or closed condition and reverse movement of the push rod means results in snap-action setting of the relay contacts in the opposite condition and wherein the relay includes at least two bender-type piezoelectric drive members the free ends of which are engageable with opposite ends of the push rod means for respectively driving the push rod means in either of the two directions to thereby selectively set the relay in either an open or closed condition.

6. An alternating current latching relay according to claim 2 wherein the bender-type piezoelectric drive member is a bimorph bender-type piezoelectric drive member having two piezoelectric plate elements secured together on each side of a common conductive plane in a unitary sandwich-like structure and wherein the excitation alternating electric current is applied in parallel across both piezoelectric plate elements to the common conductive plane.

7. An alternating current latching relay according to claim 5 wherein the bender-type piezoelectric drive members are bimorph bender-type piezoelectric drive members each having two piezoelectric plate elements secured together on each side of a common conductive plane in a unitary sandwich-like structure and wherein the excitation alternating electric current selectively is applied in parallel across both piezoelectric plate elements to the common conductive plane of each bender-type piezoelectric drive member.

8. An alternating current latching relay according to claim 2 wherein the bender-type piezoelectric drive member is a bimorph bender-type piezoelectric drive member having two piezoelectric plate elements secured together on each side of a common conductive plane in a unitary sandwich-like structure and wherein the excitation alternating electric current is applied in series across both piezoelectric plate elements and the common conductive plane.

9. An alternating current latching relay according to claim 5 wherein the bender-type piezoelectric drive members are bimorph bender-type piezoelectric drive members each having two piezoelectric plate elements secured together on each side of a common conductive plane in a unitary sandwich-like structure and wherein the excitation alternating electric current selectively is applied in series across both piezoelectric plate elements and the common conductive plane of each bender-type piezoelectric drive member.

10. An alternating current latching relay according to claim 1 wherein there are a plurality of piezoelectric drive members mechanically intercoupled to drive the push rod means.

11. An alternating current latching relay according to claim 6 wherein there are a plurality of bender-type piezoelectric drive members mechanically intercoupled to drive the respective ends of the push rod means.

12. An alternating current latching relay according to claim 7 wherein there are a plurality of bender-type piezoelectric drive members mechanically intercoupled to drive the respective ends of the push rod means.

FIG. 7 is a schematic functional diagram of a possible variation of the novel alternating current latching relay shown in FIGS. 1–6 wherein the ends of the push rods 22 and 23 of the snap-action contact switching mechanism 17 are fixed by gluing, threaded screw attachment or other similar attachment means to the free ends of the respective bender-type piezoelectric drive members 12 and 11. By this expedient, push-pull double action switching of the snap-action contact switching mechanism whereby both bender-type drive members 11 and 12 are effective in driving/pulling the push rods 22, 23 thereby achieving a greater switching force, irrespective of whether the relay device is being closed or opened. This greater switching force in turn can be translated into actuation of a larger snap-action contact switching mechanism 17 having a greater power rating for given size bender-type drive members. Alternatively, with the same size and rated bender-type drive members, a faster response time in the switching action can be obtained than that achievable with the FIGS. 1–6 arrangement wherein only one of the bender-type piezoelectric drive members 11 or 12 is effective to switch the snap-action contact switching mechanism 17 from either its closed or opened condition to the opposite condition. For this possible variation to be effective, the two bender-type drive members 11 and 12 should be identically pre-poled so that they can be driven in synchronism.

FIG. 8 is a schematic functional illustration of still another possible alternative embodiment of the invention. In FIG. 8, a set of two bender-type piezoelectric drive members 11 and 11' are interconnected by a coupling rod 61 with the push rod 23 of drive member 11' being connected to one side of the snap-action contact switching mechanism 17. On the opposite side of the snap-action switching mechanism a set of two bender-type drive members 12 and 12' likewise are interconnected by a coupling rod 62 with the push rod 22 of the snap-action switching mechanism. In this manner, increased switching force can be achieved over that accomplished with the arrangement shown in FIG. 7. In this arrangement, as with that shown in FIG. 7, additional increased pushing force is achieved by the interconnection of the dual sets of bender-type drive members 11, 11' and 12, 12' with the push rods 22 and 23 of the snap-action switching mechanism 17 so as to provide both pushing and pulling force while switching from one condition, either on or off, to the other. Again, all of the bender-type drive members in said combination should be identically pre-poled.

FIGS. 9–13 of the drawings illustrate a different embodiment of an alternating current latching relay constructed according to the invention which is somewhat different in design configuration but otherwise includes all of the elements employed in the embodiment of the invention shown and described with relation to FIGS. 1–6 of the drawings. For this reason, like parts in each of the several figures have been identified by the same reference character and function in precisely the same manner.

The most significant difference between the embodiment of the invention shown in FIGS. 9–13 and that illustrated and described with relation to FIGS. 1–6, is best shown in FIGS. 9 and 11 wherein it will be seen that the screw caps 35 secured to the dog-ear or bent ends of supply bus bars 27 and 28 extend outwardly to both sides of the body of the snap-action contact switching mechanism 17. For this purpose, the insulating mounting blocks 29 and 31 for each of the supply bus bars 27 and 28, respectively, are elongated and extend outwardly to each side of the snap-action switching mechanism 17. The elongated mounting blocks 29 and 31 are secured to the insulating upright pedestal member 14 by set screws 32 in a manner such that the fixed relay contacts 18A and 18B that are physically and electrically connected to the respective supply bus bars 27 and 28, are disposed opposite the movable contacts 19A and 19B. By this arrangement, access for a technician to the screw cap connectors 35 for connection of the input supply conductors 68, is greatly facilitated. This is in contrast to the FIG. 1-FIG. 6 arrangement wherein a technician must reach under the snap-action switch mechanism 17 in order to make connection of the supply conductors 68 to screw cap connectors 35 as best shown in FIG. 4.

FIG. 14 is a partial schematic view of the alternating current latching relay depicted in FIGS. 1–6 and illustrates an alternate AC excitation circuit for series connection of the bender-type piezoelectric drive members 11 and 12. In FIG. 14 the alternating current excitation potential is supplied through switch 46 selectively across either bender 11 or bender 12 in series. For this purpose conductor 53 is connected directly to piezoelectric plate 42 and conductor 54 is connected to plate 41 of bender drive member 12. The reverse is true with respect to bender drive member 11 where conductor 55 is connected to plate 41 and plate 42 is connected to return conductor 54. The intermediate conductive layer 43 is not connected in the circuit, while the piezoelectric plate elements are oppositely poled. Other circuit connections would work comparably well so long as the two piezoelectric plates 41 and 42 are connected in series circuit relationship across the alternating current excitation potential source.

Industrial Applicability

The invention provides new and improved alternating current piezoelectric driven latching relays for use in residential, commercial and industrial electrical distribution and control systems. The improved relays use piezoelectric drive elements which offer several potential advantages over prior art electromagnetic driven a.c. relays. The improved devices typically require lower current and dissipate very little power. As a result, substantially lower heat losses are produced and they are cheaper to operate. Further, the improved devices make available low mass structures which in turn lead to very short acutation times and require smaller space in which to be mounted than do their electromagnetic counterparts. Additionally, the devices have lower initial construction costs.

From the foregoing description it will be appreciated that the invention provides new and improved alternating current actuated latching relays of the type employing piezoelectric bender-type plate elements as relay drive members. The invention provides circuitry and methods of excitation wherein an actuating alternating current signal is applied directly to the piezoelectric bender-type plate elements. The alternating current latching relays are actuated with an alternating current switching signal or short duration and consequently, no undesired long term deformation (warp) of the piezoelectric plate elements employed in the bender-type drive members occurs during extended periods of relay usage. Additionally, relays constructed according to the invention are capable of lower voltage operation and 13. An alternating current latching relay according to claim 8 wherein there are a plurality of bender-type piezoelectric drive members mechanically intercoupled to drive the member mechanically intercoupled to drive the respective ends of the push rod means.

14. An alternating current latching relay according to claim 9 wherein there are a plurality of bender-type piezoelectric drive members mechanically intercoupled to drive the member mechanically intercoupled to drive the respective ends of the push rod means.

15. In an alternating current latching relay of the type having a latching-type snap-action switch mechanism with a set of electrical contacts that are selectively latched either in the open or the closed condition in a snap-action manner upon successive actuations of the snap-action switching mechanism by push rod means for initiating actuation of the snap-action switch mechanism; the improvement comprising at least one electrically actuated piezoelectric drive member having one end thereof secured to a common base member with said latching-type snap-action switch mechanism and the remaining free end engaging the push rod means, and selectively operable alternating current electric excitation circuit means connected to said piezoelectric drive member for selectively exciting the piezoelectric plate element thereof with an alternating current excitation field whereby the piezoelectric drive member is caused to mechanically resonate and to repeatedly strike the end of the push rod means with sufficient force to selectively actuate the snap-action switch mechanism to the opposite one of its two operating conditions from that in which it had been initially set.

16. An alternating current latching relay according to claim 15 wherein the piezoelectric drive member is a bender-type piezoelectric drive member the free end of which engages and hits the end of the operating push rod means repeatedly at a frequency dependent upon the frequency of the excitation alternating current so as to build up a sufficient magnitude of movement of the free end of the bender-type piezoelectric drive member and cause it to repeatedly hit the end of the push rod with sufficient force to selectively actuate the snap-action switch mechanism.

17. An alternating current latching relay according to claim 16 further including a mass secured to the free end of the bender-type piezoelectric drive member for adjusting the natural resonant frequency of vibration to substantially equal the frequency of the excitation alternating current.

18. An alternating current latching relay according to claim 15 wherein the snap-action switch contact mechanism is of the type wherein axial movement of the push rod means in a first direction results in snap-action setting of the relay contacts in either an open or closed condition and reverse movement of the push rod means results in snap-action setting of the relay contacts in the opposite condition and wherein the relay includes at least two bender-type piezoelectric drive members the free ends of which are engageable with opposite ends of the push rod means for respectively driving the push rod means in either of the two directions to thereby selectively set the relay in either an open or closed condition.

19. An alternating current latching relay according to claim 17 wherein the snap-action switch contact mechanism is of the type wherein axial movement of the push rod means in a first direction results in snap-action setting of the relay contacts in either an open or closed condition and reverse movement of the push rod means results in snap-action setting of the relay contacts in the opposite condition and wherein the relay includes at least two bender-type piezoelectric drive members the free ends of which are engageable with opposite ends of the push rod means for respectively driving the push rod means in either of the two directions to thereby selectively set the relay in either an open or closed condition.

20. An alternating current latching relay according to claim 16 wherein the bender-type piezoelectric drive member is a bimorph bender-type piezoelectric drive member having two piezoelectric plate elements secured together on each side of a common conductive plane in a unitary sandwich-like structure and wherein the excitation alternating electric current is applied in parallel across both piezoelectric plate elements to the common conductive plane.

21. An alternating current latching relay according to claim 19 wherein the bender-type piezoelectric drive members are bimorph bender-type piezoelectric drive members each having two piezoelectric plate elements secured together on each side of a common conductive plane in a unitary sandwich-like structure and wherein the excitation alternating electric current selectively is applied in parallel across both piezoelectric plate elements to the common conductive plane of each bender-type piezoelectric drive member.

22. An alternating current latching relay according to claim 16 wherein the bender-type piezoelectric drive member is a bimorph bender-type piezoelectric drive member having two piezoelectric plate elements secured together on each side of a common conductive plane in a unitary sandwich-like structure and wherein the excitation alternating electric current is applied in series across both piezoelectric plate elements to the common conductive plane.

23. An alternating current latching relay according to claim 19 wherein the bender-type piezoelectric drive members are bimorph bender-type piezoelectric drive members each having two piezoelectric plate elements secured together on each side of a common conductive plane in a unitary sandwich-like structure and wherein the excitation alternating electric current selectively is applied in series across both piezoelectric plate elements to the common conductive plane of each bender-type piezoelectric drive member.

24. An alternating current latching relay according to claim 15 wherein there are a plurality of piezoelectric drive members mechanically intercoupled to drive the push rod means.

25. An alternating current latching relay according to claim 20 wherein there are a plurality of bender-type piezoelectric drive members mechanically intercoupled to drive the respective ends of the push rod means.

26. An alternating current latching relay according to claim 21 wherein there are a plurality of bender-type piezoelectric drive members mechanically intercoupled to drive the respective ends of the push rod means.

27. An alternating current latching relay according to claim 22 wherein there are a plurality of bender-type piezoelectric drive members mechanically intercoupled to drive the respective ends of the push rod means.

28. An alternating current latching relay according to claim 23 wherein there are a plurality of bender-type piezoelectric drive members mechanically intercoupled to drive the respective ends of the push rod means.

29. The method of actuating an alternating current latching relay of the type having a latching-type snap-action switch mechanism including a set of electrical contacts that are selectively latched either in the open or the closed condition in a snap-action manner upon successive actuations of the snap-action switching mechanism by push rod means for initiating actuation of the snap-action switch mechanism, said relay further including at least one electrically actuated piezoelectric drive member having one end secured to a common base member with the latching-type snap-action switch mechanism and the remaining free end engaging the push rod means; said method comprising selectively and respectively exciting the piezoelectric drive member with an alternating current excitation field whereby the piezoelectric drive member is caused to mechanically resonate and to repeatedly strike the push rod means with increasing force to thereby selectively actuate the snap-action switch to the opposite one of its two operating conditions from that in which it was initially set prior to excitation of the piezoelectric drive member.

30. The method according to claim 29 wherein the piezoelectric drive member is a bender-type piezoelectric drive member the free end of which engages and hits the end of the operating push rod means repeatedly at a frequency dependent upon the frequency of the excitation alternating current so as to build up a sufficient magnitude of movement of the free end of the bender-type piezoelectric drive member and cause it to repeatedly hit the end of the push rod with sufficient force to selectively actuate the snap-action switch mechanism.

31. The method according to claim 30 further including securing a mass to the free end of the bender-type piezoelectric drive member for adjusting its natural resonant frequency of vibration to substantially equal the frequency of the excitation alternating current.

32. The method according to claim 29 wherein the snap-action switch contact mechanism is of the type in which axial movement of the push rod means in a first direction results in snap-action setting of the relay contacts in either an open or closed condition and reverse movement of the push rod means results in snap-action setting of the relay contacts in the opposite condition and wherein the relay includes at least two bender-type piezoelectric drive members the free ends of which are engageable with opposite ends of the push rod means for respectively driving the push rod means in either of the two directions to thereby selectively set the relay in either an open or closed condition.

33. The method according to claim 31 wherein the snap-action switch contact mechanism is of the type in which axial movement of the push rod means in a first direction results in snap-action setting of the relay contacts in either an open or closed condition and reverse movement of the push rod means results in snap-action setting of the relay contacts in the opposite condition and wherein the relay includes at least two bender-type piezoelectric drive members the free ends of which are engageable with opposite ends of the push rod means for respectively driving the push rod means in either of the two directions to thereby selectively set the relay in either an open or closed condition.

34. The method according to claim 30 wherein the bender-type piezoelectric drive member is a bimorph bender-type piezoelectric drive member having two piezoelectric plate elements secured together on each side of a common conductive plane in a unitary sandwich-like structure and wherein the method further comprises applying the excitation alternating electric current in parallel across both piezoelectric plate elements to the common conductive plane.

35. The method according to claim 33 wherein the bender-type piezoelectric drive members are bimorph bender-type piezoelectric drive members each having two piezoelectric plate elements secured together on each side of a common conductive plane in a unitary sandwich-like structure and wherein the method further comprises selectively applying the excitation alternating electric current in parallel across both piezoelectric plate elements to the common conductive plane of each bender-type piezoelectric drive member.

36. The method according to claim 30 wherein the bender-type piezoelectric drive member is a bimorph bender-type piezoelectric drive member having two piezoelectric plate elements secured together on each side of a common conductive plane in a unitary sandwich-like structure and wherein the method further comprises applying the excitation alternating electric current in series across both piezoelectric plate elements to the common conductive plane.

37. The method according to claim 33 wherein the bender-type piezoelectric drive members are bimorph bender-type piezoelectric drive members each having two piezoelectric plate elements secured together on each side of a common conductive plane in a unitary sandwich-like structure and wherein the method further comprises selectively applying the excitation alternating electric current in series across both piezoelectric plate elements to the common conductive plane of each bender-type piezoelectric drive member.

38. The method according to claim 29 further comprising mechanically interconnecting a plurality of piezoelectric drive members to drive the push rod means.

39. The method according to claim 34 further comprising mechanically interconnecting a plurality of bender-type piezoelectric drive members to drive the respective ends of the push rod means.

40. The method according to claim 35 further comprising mechanically interconnecting a plurality of bender-type piezoelectric drive members to drive the respective ends of the push rod means.

41. The method according to claim 36 further comprising mechanically interconnecting a plurality of bender-type piezoelectric drive members to drive the respective ends of the push rod means.

42. The method according to claim 37 further comprising mechanically interconnecting a plurality of bender-type piezoelectric drive members to drive the respective ends of the push rod means.

* * * * *